United States Patent [19]

Samata et al.

[11] Patent Number: 4,579,601
[45] Date of Patent: Apr. 1, 1986

[54] METHOD OF GROWING A RESISTIVE EPITAXIAL LAYER ON A SHORT LIFETIME EPI-LAYER

[75] Inventors: Shuichi Samata, Yokohama; Yoshiaki Matsushita, Kawasaki, both of Japan

[73] Assignee: Kabushiki Kaisha Toshiba, Japan

[21] Appl. No.: 635,434

[22] Filed: Jul. 27, 1984

[30] Foreign Application Priority Data

Jul. 29, 1983 [JP] Japan .................. 58-138858

[51] Int. Cl.$^4$ .............. H01L 21/20; H01L 21/225; H01L 21/265
[52] U.S. Cl. .................. 148/1.5; 148/175; 148/187; 29/571; 29/576 B
[58] Field of Search .............. 148/1.5, 187, 175; 29/576 B, 571

[56] References Cited

U.S. PATENT DOCUMENTS

| | | | |
|---|---|---|---|
| 4,001,864 | 6/1977 | Gibbons | 357/30 |
| 4,053,925 | 10/1977 | Burr et al. | 148/1.5 |
| 4,082,571 | 4/1978 | Graul et al. | 148/1.5 |
| 4,116,719 | 9/1978 | Shimizu et al. | 148/1.5 |
| 4,318,750 | 3/1982 | Rai-Choudhury et al. | 148/1.5 |
| 4,328,610 | 5/1982 | Thompson et al. | 148/1.5 |
| 4,332,627 | 6/1982 | Schmitt et al. | 148/1.5 |
| 4,459,159 | 7/1984 | O'Mara | 148/1.5 |
| 4,490,182 | 12/1984 | Scovell | 148/1.5 |
| 4,505,759 | 3/1985 | O'Mara | 148/1.5 |
| 4,506,436 | 3/1985 | Bakeman, Jr. et al. | 29/576 B |
| 4,535,529 | 8/1985 | Jochems | 148/175 |

FOREIGN PATENT DOCUMENTS 0018430 2/1981 Japan .................. 29/576 T
57-87119 5/1982 Japan .

OTHER PUBLICATIONS

Cerofouno et al., J. Appl. Phys. 55 (9184) 579.
Srinivasan, "Silicon Epitaxy for High Performance Integrated Circuits," Solid State Technology, Nov. 1981.
Yaney et al., "The Use of Thin Epitaxial Silicon Layers For MOS VLSI," IEDM, pp. 236–239, Nov. 1981.
IBM Technical Disclosure Bulletin, vol. 25, No. 4, Sep. 1982.
Extended Abstracts of the Electrochemical Society, vol. 82-2, Oct. 1982.
Japanese Journal of Applied Physics, vol. 21, Supplement 21-1, 1982.

Primary Examiner—Upendra Roy
Attorney, Agent, or Firm—Finnegan, Henderson, Farabow, Garrett & Dunner

[57] ABSTRACT

A method for manufacturing a semiconductor device has the steps of: forming a first thin single-crystal semiconductor layer on a semiconductor substrate of one conductivity type which contains oxygen, the first thin single-crystal semiconductor layer having a higher resistivity than that of the semiconductor substrate and having the same conductivity type as that of the semiconductor substrate; ion-implanting an electrically inactive impurity in the first thin single-crystal semiconductor layer; forming a second thin single-crystal semiconductor layer on the first thin single-crystal semiconductor layer, the second thin single-crystal semiconductor layer having the same conductivity type as that of the semiconductor substrate and having a higher resistivity than that of the semiconductor substrate; performing annealing for not less than four hours at a temperature of 550° C. to 900° C. after the electrically inactive impurity is ion-implanted; and forming a cell of a dynamic random access memory in the second thin single-crystal semiconductor layer, the cell having one transistor and one capacitor.

11 Claims, 34 Drawing Figures

F I G. 5J
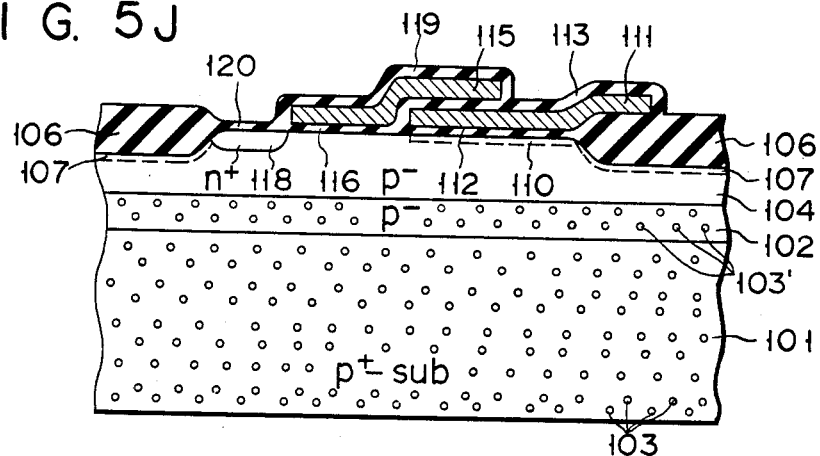
F I G. 5K
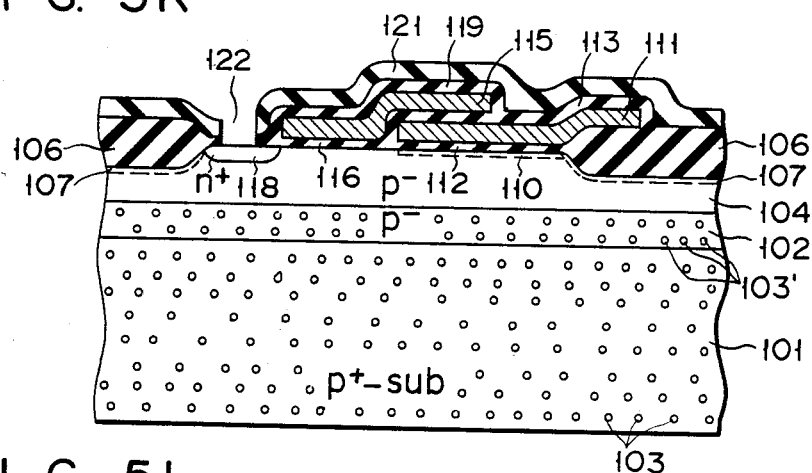
F I G. 5L
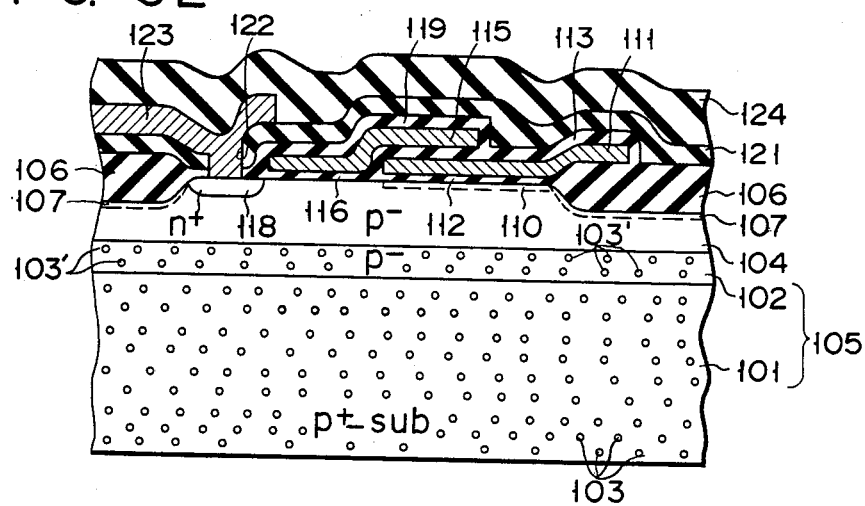

METHOD OF GROWING A RESISTIVE EPITAXIAL LAYER ON A SHORT LIFETIME EPI-LAYER

BACKGROUND OF THE INVENTION

The present invention relates to a method for manufacturing a semiconductor device and, more particularly, to a method of manufacturing a semiconductor device having an improved semiconductor body with elements such as memory cells of a random access memory (RAM) device, each memory cell having one transistor and one capacitor.

A dynamic RAM device is known as one semiconductor memory. A conventional semiconductor body of this memory comprises an intrinsic gettering wafer (i.e., an IG wafer) which has a gettering effect obtained from microdefects formed inside a semiconductor substrate (wafer) whose surface region is free from defects. Another typical semiconductor body is an epitaxial wafer wherein a high-resistance semiconductor epitaxial layer is grown on a low-resistance semiconductor substrate. An IG wafer has a gettering effect inside. The gettering effect will not be lost in the fabrication process of a semiconductor memory, thereby preventing oxidation-induced stacking faults (OSF). A semiconductor memory having such an IG wafer can effectively prevent junction leakage and the like. In a memory having an epitaxial wafer, since the electric resistance of the substrate is very low, the lifetime of carriers in the substrate can be rendered extremely short. For this reason, the diffusion length of the electrons accidentally generated in the substrate can be decreased, thus prolonging the pause time.

There has been recently proposed a dynamic RAM device having a two-layer electrode which utilizes a semiconductor body with the advantages of both the IG and epitaxial wafers. A memory cell of this device will be described with reference to FIG. 1. Reference numeral 1 denotes a low-resistance p+-type IG wafer having microdefects 2 inside. A p−-type single-crystal semiconductor layer 3 is formed by epitaxial growth on the IG wafer 1. The IG wafer 1 and the semiconductor layer 3 constitute a semiconductor body 4. A field oxide film 5 is selectively formed on the surface of the semiconductor layer 3. A p-type inversion preventive layer 6 is formed in the semiconductor layer 3 to extend underneath the field oxide film 5. A thin oxide film 7 is formed in an island region of the semiconductor layer 3 which is isolated by the field oxide film 5. A capacitor electrode 8 of polycrystalline silicon is formed on the oxide film 7. One end of the electrode 8 extends on the field oxide film 5. An n-type layer 9 is formed in the semiconductor layer 3 to extend underneath the capacitor electrode 8, and a thick oxide film 10 is formed to cover the capacitor electrode 8. Reference numeral 11 denotes a transfer gate electrode of polycrystalline silicon. Part of the transfer gate electrode 11 is located in the island region, and one end thereof extends on the oxide film 10 covering the capacitor electrode 8. A gate oxide film 12 is sandwiched between the gate electrode 11 and the island region. An n+-type layer 13 as a bit line is selectively formed on the island region between the field oxide film 5 and the gate oxide film 12. A thick oxide film 14 is formed to cover the transfer gate electrode 11. In addition, an insulating interlayer 15 is formed to cover the oxide films 5, 10 and 14. An Al wiring strip 17 is formed on the insulating interlayer 15 so as to electrically contact the n+-type layer 13 through a contact hole 16. A protective film 18 of an insulating material is formed to cover the entire surface of the resultant structure. In this dynamic RAM device, OSF and shallow pits are decreased by the IG effect to improve the performance of the semiconductor body 4.

However, in the semiconductor body 4 having such a dynamic RAM device structure, because the difference between the impurity concentrations of the p+-type IG wafer 1 and the p−-type single-crystal semiconductor layer 3 is large, a potential barrier is formed at the p+-p− junction. As a result, when α-rays become incident on the memory cell of the dynamic RAM device and electrons are accidentally generated in the p−-type single-crystal semiconductor layer 3, as shown in FIG. 2, the electrons are reflected at the interface between the semiconductor layer 3 and the IG wafer 1 and are returned to the semiconductor layer 3, thereby preventing diffusion and gettering of the IG wafer 1. For this reason, electrons reach under the capacitor electrode 8 formed on the semiconductor layer 3 and so cause data inversion. Therefore, the ratio soft errors caused by α-rays in the dynamic RAM device having the semiconductor body 4 become worse than those of the conventional RAM device having an IG wafer.

On the other hand, a complementary metal oxide semiconductor integrated circuit (CMOS-IC) having the semiconductor body described above is also known. This CMOS-IC will be described with reference to FIG. 3.

Reference numeral 21 denotes an n+-type IG silicon wafer having a number of microdefects 22 therein. An n−-type single-crystal silicon layer 23 is formed by epitaxial growth on the IG silicon wafer 21. The IG silicon wafer 21 and the silicon layer 23 constitute a silicon body 24. A p-type well region (i.e., p-well) 25 is selectively formed in a surface layer of the silicon layer 23. A field oxide film 26 is selectively formed in the surface of the n−-type silicon layer 23. An n+-type inversion preventive layer and a p+-type inversion preventive layer (not shown) are respectively formed at portions of the n−-type silicon layer 23 below the field oxide film 26 and in the p-well 25, respectively. P+-type source and drain regions $27_1$ and $28_1$ electrically insulated from each other are formed in an island region of the silicon layer 23 which is isolated by the field oxide film 26. An n+-type diffusion region $29_1$ is formed in the island region of the n-type silicon layer 23 which is adjacent to the source region $27_1$. The n+-type diffusion region $29_1$ serves to bias the silicon layer 23. A polycrystalline silicon gate electrode $31_1$ is formed on a gate oxide film 30 which is formed on a portion of the silicon layer 23 including the channel region between the source and drain regions $27_1$ and $28_1$. n+-type source and drain regions $27_2$ and $28_2$ electrically insulated from each other are formed in the island region of the p-well 25 which is isolated by the field oxide film 26. A p+-type diffusion region $29_2$ is formed in the island region of the p-well 25 which is adjacent to the source region $27_2$ so as to bias the p-well 25. A polycrystalline silicon gate electrode $31_2$ is formed on the gate oxide film 30 formed on the island region of the p-well 25 which includes the channel region between the source and drain regions $27_2$ and $28_2$. An insulating interlayer 32 is formed to cover the silicon layer 23 including the gate electrodes $31_1$ and $31_2$. An Al source wiring strip 33 is formed on the insulating interlayer 32 so as to form an electrical contact with both the p+-type source region 27₁ and the n+-type diffusion region 29₁ through respective contact holes. An Al drain wiring strip 34 is formed on the insulating interlayer 32 so as to form an electrical contact with the drain regions 28₁ and 28₂ through respective contact holes. Al gate wiring strip 35 is formed on the insulating interlayer 32 so as to form an electrical contact with the gate electrodes 31₁ and 31₂ through the respective contact holes. An Al source wiring strip 36 is formed on the insulating interlayer 32 so as to form an electrical contact with the n+-type source region 27₂ and the p+-type diffusion region 29₂ through the respective contact holes. Note that the Al gate wiring strip 35 is bonded to a Vin terminal, the Al drain wiring strip 34 is bonded to a Vout terminal, the Al source wiring strip 33 of the p-channel MOS transistor is bonded to a $V_{DD}$ terminal, and the Al source wiring strip 36 of the n-channel MOS transistor is bonded to a $V_{SS}$ terminal.

However, the CMOS-IC shown in FIG. 3 is prone to a latch-up phenomenon. This phenomenon will be described in detail with reference to FIGS. 3 and 4, in which FIG. 4 shows an equivalent circuit for explaining the thyristor effect.

In this CMOS transistor, a parasitic npn transistor Qn and a parasitic pnp transistor Qp are formed. The parasitic npn transistor Qn has the n+-type source region 27₂ of the n-channel MOS transistor as an emitter, the p-well 25 as a base and the n⁻-type silicon layer 23 as a collector. The parasitic pnp transistor Qp has the p+-type source region 27₁ as an emitter, the n⁻-type silicon layer 23 as a base and the p-well 25 as a collector. On the other hand, when the source regions 27₁ and 27₂ and the drain regions 28₁ and 28₂ of the respective MOS transistors are micropatterned along with an increase in packing density of the CMOS-ICs, electrons are generated by impact ionization in the vicinity of the drain region 28₁ when the p-channel MOS transistor is turned on. These electrons are reflected by the interface between the n+-type IG wafer 21 and the n⁻-type silicon layer 23 and are returned to the silicon layer 23. As described with reference to FIG. 2, the electrons will not be trapped by the microdefects in the IG wafer 21. A potential at the n⁻-type silicon layer 23 is decreased, and then the parasitic pnp transistor Qp having the n⁻-type silicon layer 23 as the base is subjected to bipolar action. As a result, a collector current $I_{RW}$ of the transistor Qp flows through the p-well 25. More specifically, the collector current $I_{RW}$ flows through a resistor $R_W$ at the $V_{SS}$ side of the p-well 25, thereby increasing the bias voltage to the base of the parasitic npn transistor Qn. As a result, the parasitic npn transistor Qn is subjected to bipolar action. A collector current $I_{RS}$ of the parasitic transistor Qp flows in the n⁻-type silicon layer 23 to lower the potential at the base of the parasitic pnp transistor Qp. Even if impact ionization no longer occurs, the transistor Qp is subjected to bipolar action since the base potential thereof is lowered. The collector current $I_{RW}$ increases the potential at the base of the parasitic npn transistor Qn so that the collector current $I_{RS}$ of the transistor Qn easily flows, thereby further lowering the base potential of the parasitic pnp transistor Qp and increasing the base potential of the transistor Qp. According to this positive feedback, a large current flows from the $V_{DD}$ terminal to the $V_{SS}$ terminal, as shown in FIG. 4. In addition to the disadvantage that the CMOS can become inoperative due to the latch-up current, the CMOS-IC as a whole can be thermally damaged by the large current. In the above operation, when the n-channel MOS transistor is simultaneously turned on, holes are generated by impact ionization in the vicinity of the drain region 28₂, thereby increasing the potential at the p-well 25 and hence causing a larger current to flow from the $V_{DD}$ terminal to the $V_{SS}$ terminal, in addition to the effect described above.

SUMMARY OF THE INVENTION

It is an object of the present invention to provide a method of manufacturing a semiconductor device having a semiconductor body obtained such that a first thin single-crystal semiconductor layer with microdefects and a resistivity (1 Ωcm or more) higher than that of a semiconductor substrate also having microdefects and a resistivity of 0.5 Ωcm or less is formed on the semiconductor substrate, and a second single-crystal semiconductor layer with the same high resistivity as that of the first thin single-crystal semiconductor layer and with no microdefects is formed on the first single-crystal semiconductor layer.

It is another object of the present invention to provide a method for manufacturing a dynamic RAM device immune to soft errors caused by α-rays and capable of prolonging the pause time.

It is still another object of the present invention to provide a method for manufacturing a dynamic RAM device improving the bump-up.

It is still another object of the present invention to provide a method for manufacturing a CMOS-IC greately resistant to the latch-up phenomenon.

According to the present invention, there is provided a method for manufacturing a semiconductor device, comprising the steps of:

forming a first thin single-crystal semiconductor layer on an oxygen-doped semiconductor substrate of one conductivity type, said first thin single-crystal semiconductor layer having one conductivity type and a higher resistivity than that of said semiconductor substrate;

ion-implanting an electrically inactive impurity in said first thin single-crystal semiconductor layer;

forming a second thin single-crystal semiconductor layer on said first thin single-crystal semiconductor layer, said second thin single-crystal semiconductor layer having one conductivity type and a higher resistivity than that of said semiconductor substrate;

performing annealing at a temperature of 550° C. to 900° C. for not less than four hours after the electrically inactive impurity is ion-implanted; and forming elements on said second thin single-crystal semiconductor layer.

The semiconductor substrate has a p or n conductivity type. The concentration of oxygen contained in the semiconductor substrate is preferably higher than $7 \times 10^{17}$ cm⁻³ so as to form high-density microdefects in the substrate upon annealing. In addition, the semiconductor substrate must have a low resistivity. More particularly, the resistivity must be not more than 0.5 Ωcm.

The first thin single-crystal semiconductor layer must have a higher resistivity than that of the semiconductor substrate. More particularly, it is preferable to form on the semiconductor substrate a thin layer which has a resistivity of 1.0 Ωcm. This thin layer is formed by, for example, epitaxial growth. The thin layer preferably has a thickness of not more than 3 μm. When the thickness of the layer exceeds 3 μm, it is difficult for the low-resistance semiconductor substrate to effectively stabilize the potential at the second thin single-crystal semiconductor layer formed on the first one.

The electrically inactive impurity is ion-implanted in the first thin single-crystal semiconductor layer to form microdefects therein and hence provide a gettering effect. The impurity is an element selected from the group consisting of oxygen, carbon, nitrogen, silicon, germanium, tin, argon, xenon, neon, krypton, and a combination thereof.

The second thin single-crystal semiconductor layer must have a higher resistivity than that of the semiconductor substrate. More particularly, it is preferable to form on the semiconductor substrate a thin layer which has a resistivity of 1.0 $\Omega$cm. This thin layer is formed by, for example, epitaxial growth. The thin layer preferably has a thickness falling within the range between 3 and 10 $\mu$m.

Annealing as described above is performed to form high-density microdefects in the semiconductor substrate and to cause the ion-implanted impurity to form microdefects in the first thin single-crystal semiconductor layer, after the impurity is ion-implanted in the first thin single-crystal semiconductor layer. More specifically, annealing is suitably performed immediately after the impurity is ion-implanted in the first thin single-crystal semiconductor layer. Alternatively, annealing may be performed immediately after the second thin single-crystal semiconductor layer is formed.

BRIEF DESCRIPTION OF THE DRAWINGS

FIGS. 5A to 5L are sectional views for explaining the steps in manufacturing a dynamic RAM device according to Example 1 of the present invention;

DESCRIPTION OF THE PREFERRED EMBODIMENTS

The present invention will be described by way of examples.

EXAMPLE 1

Example 1 refers to a memory cell (of a dynamic RAM device) having one transistor and one capacitor in a two-layer electrode.

Figure 1:
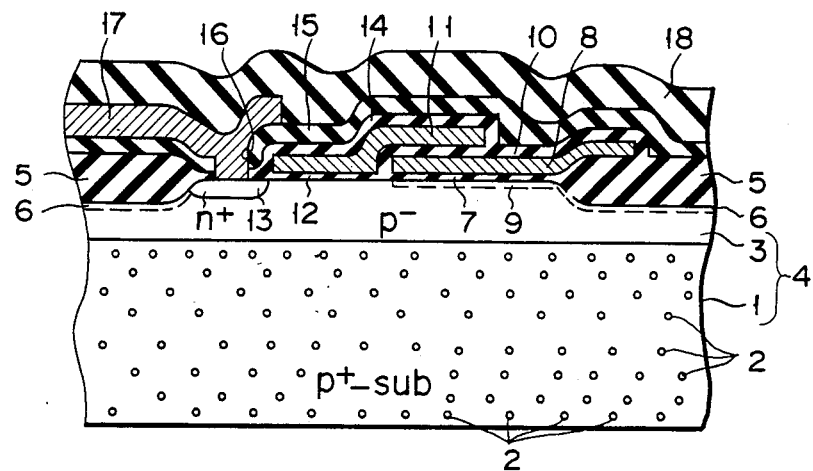
FIG. 1 is a sectional view of a memory cell of a conventional dynamic RAM device.
Figure 2:
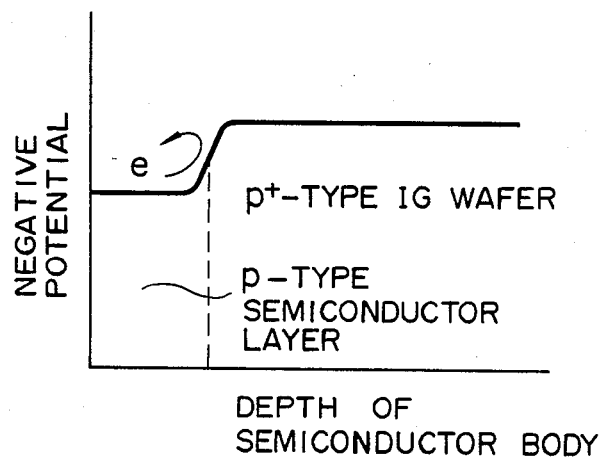
FIG. 2 is a graph showing the relationship between the negative potential and the depth of a semiconductor body used in the dynamic RAM device of FIG. 1.
Figure 3:
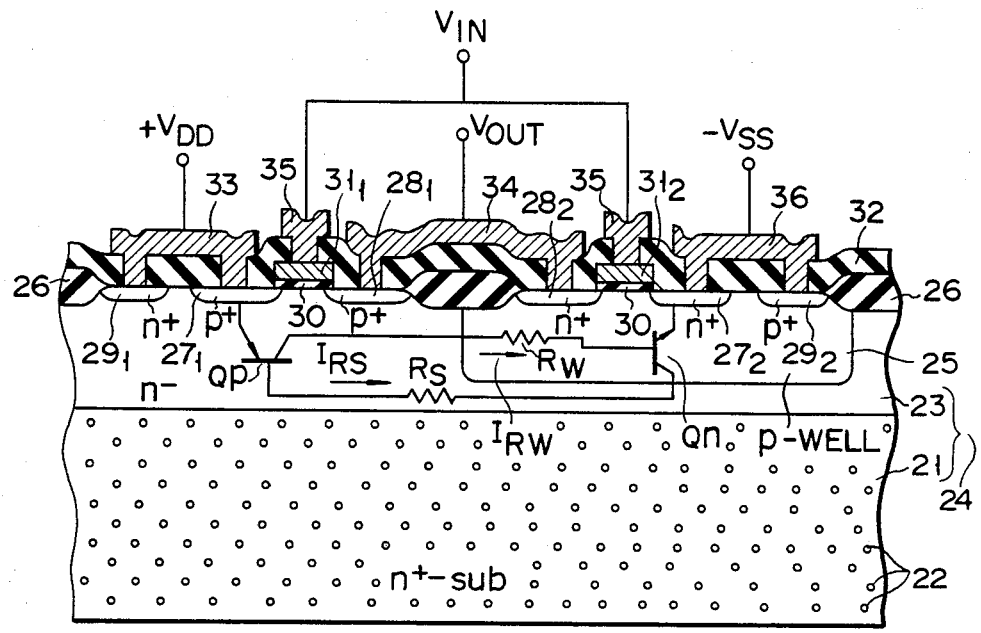
FIG. 3 is a sectional view of a conventional CMOS-IC.
Figure 4:
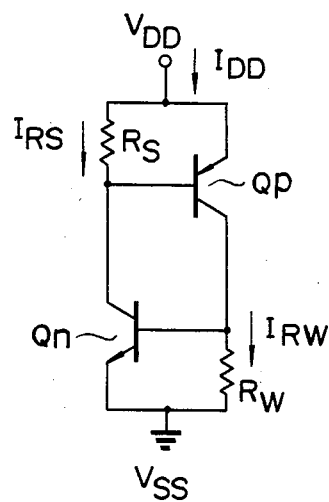
FIG. 4 is an equivalent circuit diagram of a conventional CMOS transistor so as to explain the thyristor effect.
Figure 5A:
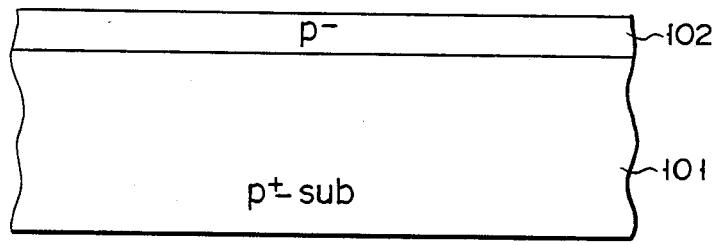

As showing in FIG. 5A, a boron-doped p+-type single-crystal silicon substrate 101 having a resistivity of 0.01 $\Omega$cm and the (100) crystal direction was prepared. Then a first p⁻-type thin single-crystal silicon layer 102 was epitaxially grown on the silicon substrate 101 to a thickness of about 3 $\mu$m in an atmosphere of a gas mixture of SiCl$_4$ and H$_2$ at a temperature of 1,180° C. for three minutes. The thin silicon layer 102 had a resistivity of, for example, 10 $\Omega$cm. Note that the single-crystal silicon substrate 101 was prepared from wafers obtained by cutting a single-crystal silicon ingot pulled up by the Czochralski (CZ) technique. The initial concentration of oxygen contained in the single-crystal silicon substrate 101 was $1 \times 10^{18}$ cm$^{-3}$.

Figure 5B:
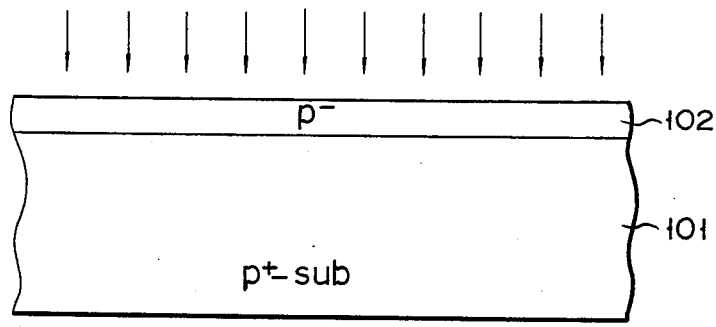
Figure 5C:
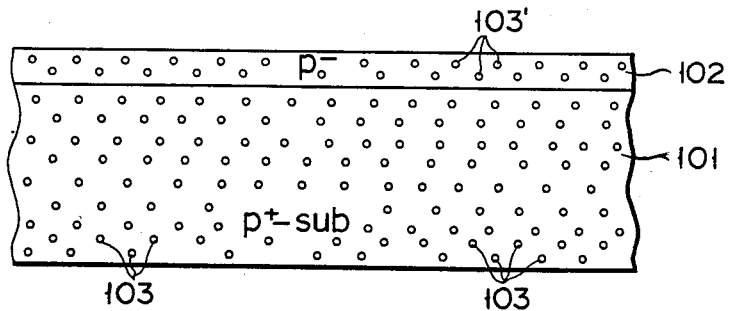
Figure 5D:
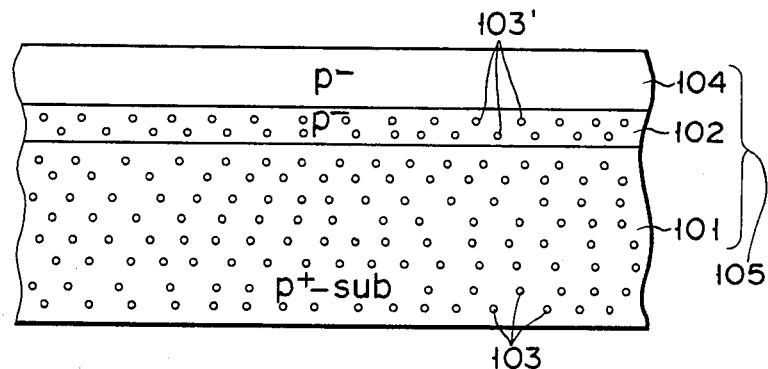

As shown in FIG. 5B, oxygen was ion-implanted at an acceleration voltage of 100 keV and a dose of $1 \times 10^{16}$ cm$^{-2}$ in entire surface of the first single-crystal thin silicon layer 102. Subsequently, the resultant structure was annealed in an oxygen atmosphere at a temperature of 700° C. for eight hours. In this case, as shown in FIG. 5C, microdefects 103 were formed inside the p+-type single-crystal silicon substrate 101, and microdefects 103' were formed not only inside the first thin single-crystal silicon layer 102 but in the surface region thereof. As shown in FIG. 5D, the resultant structure was subjected to silicon epitaxial growth in an atmosphere of SiCl$_4$ and H$_2$ at a temperature of 1,180° C. for five minutes, thereby forming a second thin single-crystal silicon layer 104 on the first thin single-crystal silicon layer 102 having the microdefects 103'. The second thin single-crystal silicon layer 104 had a resistivity of 10 $\Omega$cm and a thickness of 5 $\mu$m. The p+-type single-crystal silicon substrate 101 having the microdefects 103 therein, the first p⁻-type thin single-crystal silicon layer 102 having the microdefects 103' therein and being formed on the silicon substrate 101, and the second p⁻-type thin single-crystal silicon layer 104 formed on the first thin layer 102 constituted a semiconductor body 105.

Figure 5E:
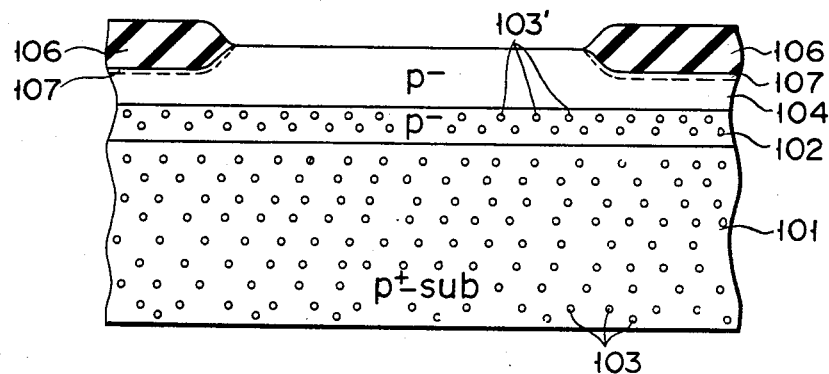
Figure 5F:
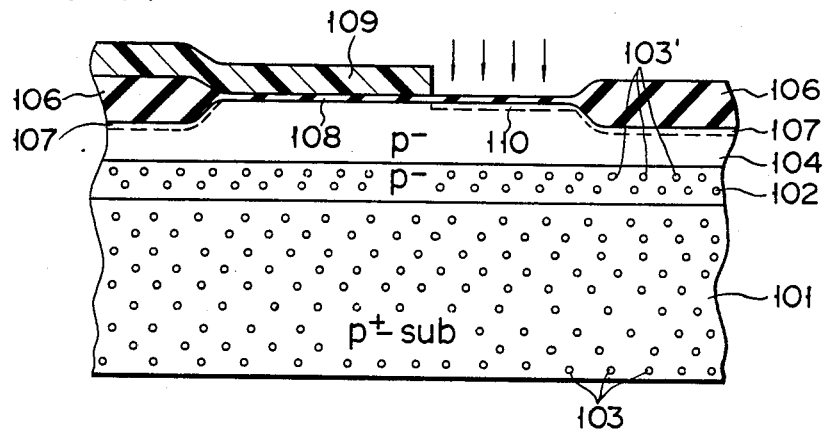

As shown in FIG. 5E, boron ion implantation and selective oxidation were performed to form a field oxide film 106 on the surface of the second thin layer 104 and a p-type inversion preventive layer 107 in a portion of the second thin layer 104 which was located under the field oxide film 106. Subsequently, the resultant structure was thermally oxidized to form a thermal oxide film 108 on an island region of the second thin layer 104 which was isolated by the field oxide film 106, as shown in FIG. 5F. A photoresist pattern 109 having an opening corresponding to a prospective capacitor region was formed by the photoengraving process (PEP). Arsenic ions were implanted at an acceleration voltage of 150 KeV and a dose of $1 \times 10^{13}$ cm$^{-2}$ by using as masks the photoresist pattern 109 and the field oxide film 106, thereby selectively forming an n-type layer 110 in the second thin layer 104.

Figure 5G:
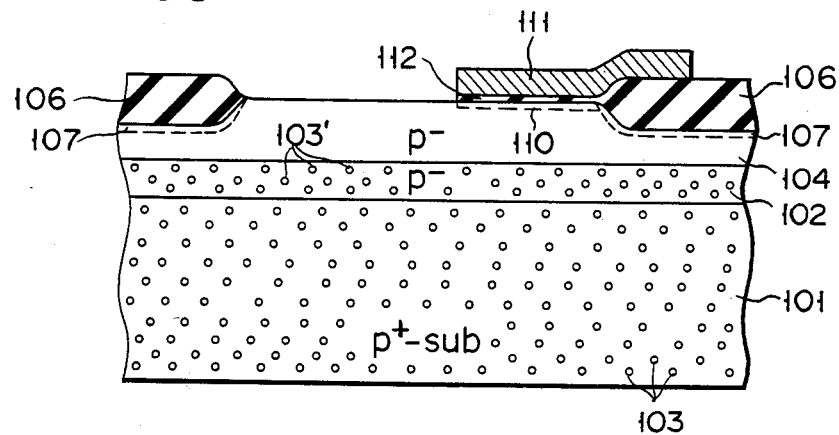

As shown in FIG. 5G, after the photoresist pattern 109 was removed, a phosphorus-doped polycrystalline silicon film was deposited by the CVD (chemical vapor deposition) method to a thickness of about 4,000 Å. This polycrystalline silicon film was patterned by a photoresist pattern (not shown) to form a capacitor electrode 111 one end of which extends over the field oxide film 106. The thermal oxide film 108 was selectively etched using the capacitor electrode 111 as a mask, and a capacitor oxide film 112 was thus formed.

Figure 5H:
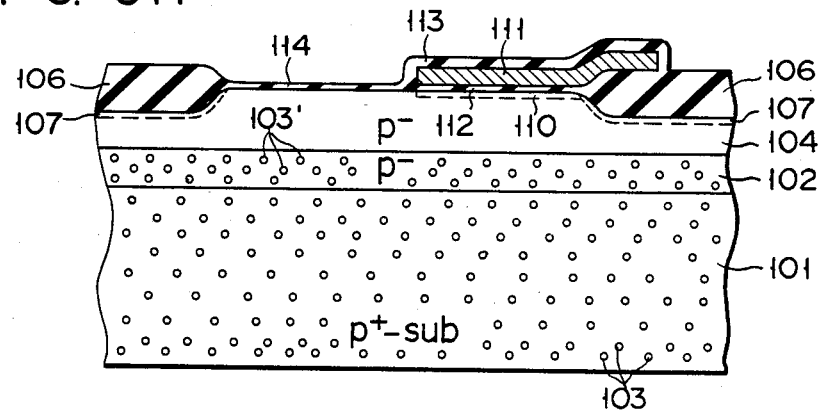

Subsequently, as shown in FIG. 5H, thermal oxidation was performed in a dry oxygen atmosphere at a temperature of 1,000° C. to form an oxide film 113 of a thickness of 1,000 Å over and around the polycrystalline silicon capacitor electrode 111 and to form an oxide film 114 of a thickness of 400 Å on an exposed portion of the second thin layer 104.

Figure 5I:
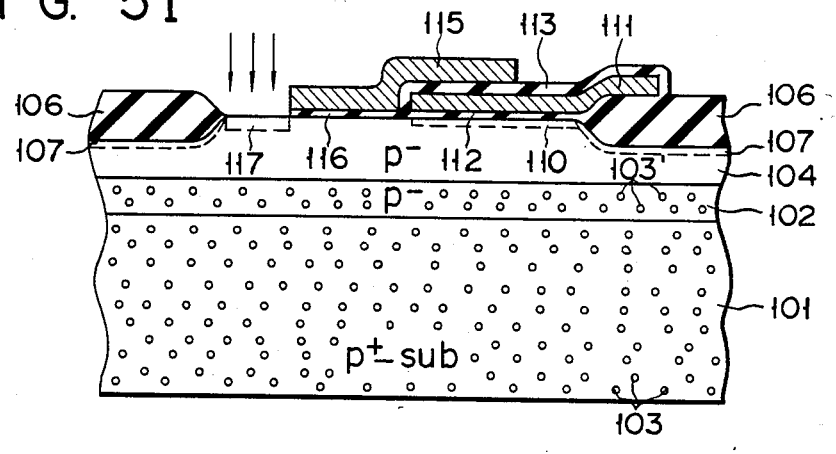

As shown in FIG. 5I, a phosphorus-doped polycrystalline silicon film was deposited to cover the entire surface and was patterned using a photoresist pattern (not shown), thereby forming a transfer gate electrode 115. Subsequently, the oxide film 114 on the second thin film 104 was selectively etched using the transfer gate electrode 115 as a mask. In this way, a gate oxide film 116 was thus obtained. At the same time a second thin film 104 was partially exposed. Thereafter, arsenic ions were implanted at an acceleration voltage of 40 keV and a dose of $1 \times 10^{15}$ cm$^{-2}$ by using as masks the transfer gate electrode 115 and the field oxide film 106, thereby selectively forming a arsenic ion-injected layer 117 in the exposed portion of the second thin layer 104. Subsequently, the resultant structure was subjected to thermal oxidation in a wet oxygen atmosphere at 1,000° C. In this case, as shown in FIG. 5J, the arsenic ion-injected layer 117 was activated to form an n$^+$-type layer (bit line) 118. At the same time, an oxide film 119 of a thickness of 1,000 Å and an oxide film 120 of a thickness of 1,000 Å were formed over and around the polycrystalline silicon transfer gate electrode 115 and on the n$^+$-type layer 118, respectively.

As shown in FIG. 5K, a phosphosilicate glass (PSG) film 121 of a thickness of 5,000 Å was deposited by the CVD method to cover the entire surface, and portions of the oxide film 120 and the PSG film 121 which respectively correspond to part of the n$^+$-type layer 118 were etched to form a contact hole 122. As shown in FIG. 5L, an Al film was deposited to cover the entire surface and was patterned to form an Al wiring strip 123 which was in contact with the n$^+$-type layer 118 through the contact hole 122. Finally, a PSG film 124 was formed to cover the entire surface to a thickness of 1.5 μm, thereby preparing a memory cell of a dynamic RAM.

CONTROL 1

Figure 6A:
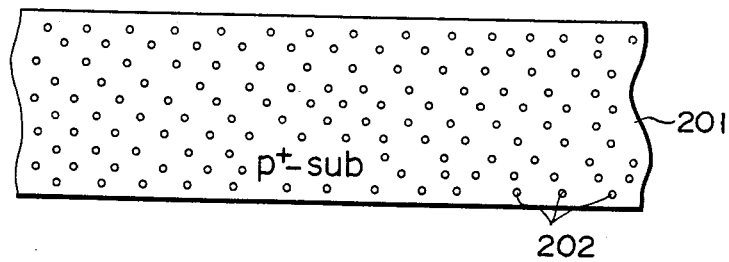
FIGS. 6A to 6C are sectional views for explaining the steps in manufacturing a dynamic RAM device according to Control 1.
Figure 6B:
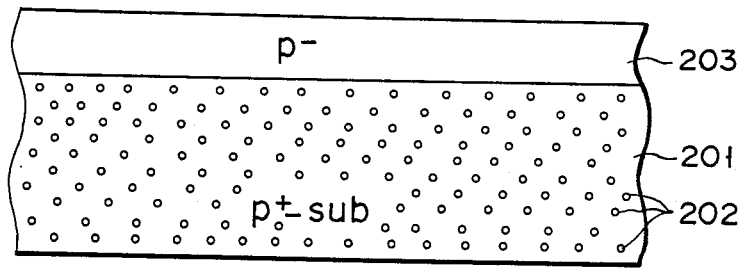
Figure 6C:
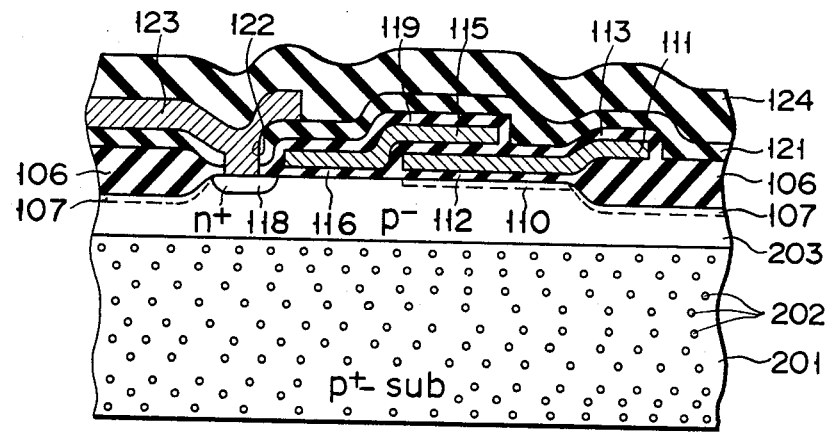

As shown in FIG. 6A, a boron-doped (p$^+$-type) single-crystal silicon substrate 201 having a resistivity of 0.01 Ωcm, an initial oxygen concentration of $1 \times 10^{18}$ cm$^{-3}$ and the (100) crystal direction was annealed in an oxygen atmsophere at a temperature of 700° C. for eight hours, thereby forming microdefects 202 throughout the entire internal region. As shown in FIG. 6B, a p$^-$-type thin single-crystal silicon layer 203 was formed by epitaxial growth on the silicon substrate 201 in an atmosphere of SiCl$_4$ and H$_2$ at a temperature of 1,180° C. for five minutes. The p$^-$-type thin silicon layer 203 had a resistivity of 10 Ωcm and a thickness of 5 μm. Subsequently, in the same manner as the steps in FIGS. 5E to 5L of Example 1, a memory cell of a dynamic RAM was formed on the surface of the p$^-$-type thin single-crystal silicon layer 203, as shown in FIG. 6C. As a result, a dynamic RAM was prepared.

CONTROL 2

Figure 7:
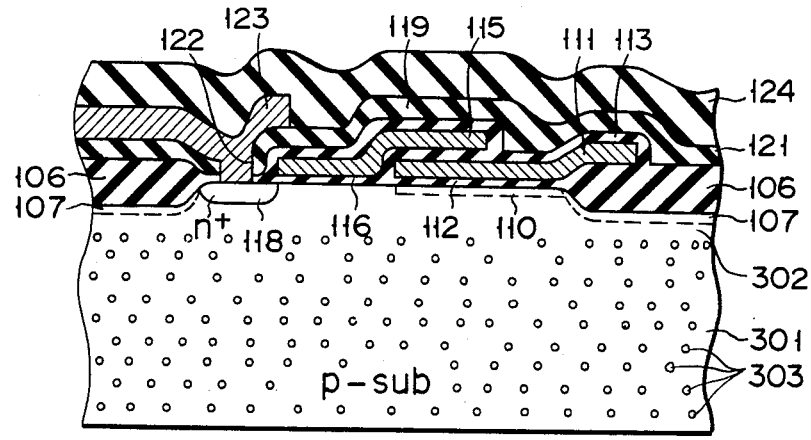
FIG. 7 is a sectional view of a dynamic RAM device according to Control 2.

A p$^-$-type single-crystal silicon substrate 301 (FIG. 7) having a resistivity of 10 Ωcm, an initial oxygen concentration of $1 \times 10^{18}$ cm$^{-3}$, and the (100) crystal direction was annealed in an oxygen atmosphere at 1,100° C. for 4 hours, thereby performing outer diffusion on the oversaturated oxygen in the surface region of the substrate 301 and forming a layer of a low oxygen concentration. Then, the substrate 301 was annealed in an oxygen atmosphere at 800° C. to precipitate oversaturated oxygen from the silicon substrate 301. Subsequently, the silicon substrate 301 was further annealed in an oxygen atmosphere at 1,000° C. for four hours to grow the oversaturated oxygen precipitate in the substrate 301, and a defect-free layer 302 was formed. At the same time, the precipitate inside the substrate 301 was segregated to form high-density microdefects 303. In the same manner as in the steps of FIGS. 5E to 5L of Example 1, a memory cell was formed in the defect-free layer 302 on the silicon substrate 301, as shown in FIG. 7. Thus, a dynamic RAM was prepared.

CONTROL 3

Figure 8:
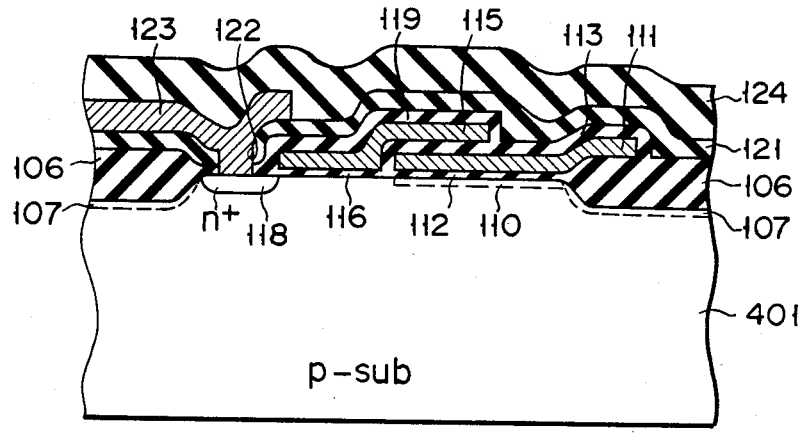
FIG. 8 is a sectional view of a dynamic RAM device according to Control 3.

A p$^-$-type single-crystal silicon substrate 401 was prepared. This silicon substrate 401 had a resistivity of 10 Ωcm and the (100) crystal direction. In the same manner as the steps of FIGS. 5E to 5L of Example 1, memory cell was formed on the silicon substrate 401 as shown in FIG. 8. As a result, a dynamic RAM was prepared.

The soft error, pause time and bump-up of the dynamic RAMs prepared by Example 1 and Controls 1 to 3 were examined. The test results were shown in the following table. Note that the soft error, pause time and bump-up of the respective RAMs were evaluated in accordance with the following methods:

(1) Soft Error Test

The cover of each dynamic RAM device was opened, and data of logic "1" was written in all memory cells. The data were read out from the memory cells while irradiating them with α-rays. The number of error bits per hour was measured. In other words, the soft errors were evaluated in accordance with the forced test by the α-rays.

(2) Pause Time Test

Data of logic "1" was written in one of the memory cells of each dynamic RAM at a voltage $V_{CC}$ of 4.5 to 5.5 V and a temperature of 75° C. The written data was stored for a predetermined period of time, and the dynamic RAM was evaluated by a time interval (pause time) after which the written data could not be read out. In general, the longer the pause time becomes, the less the capacitor charged with electrons is influenced. In this case, the memory cell has good electrical characteristics.

(3) Bump-Up Test

Write and read voltages $V_{CC}$ for each memory cell of each dynamic RAM were initially set to be 5.5 V and 4.5 V, respectively. The write and read voltages were changed to evaluate the respective dynamic RAMs by determining the allowances (percent) for the write and read voltage changes which ensured the normal operation of the RAMs. In this test, the allowances were influenced by the resistances of the substrates. In general, the higher the allowance becomes, the higher the reliability of the memory cell.

TABLE

|  | Soft error (bit/hour) | Pause time (msec) | Bump-up (%) |
| --- | --- | --- | --- |
| Example 1 | 500 | 100–150 | 22 |
| Control 1 | 1000 | 25 | 22 |

TABLE-continued

|  | Soft error (bit/hour) | Pause time (msec) | Bump-up (%) |
|---|---|---|---|
| Control 2 | 600 | 50 | 16 |
| Control 3 | 1000 | 30 | 15 |

Figure 9:
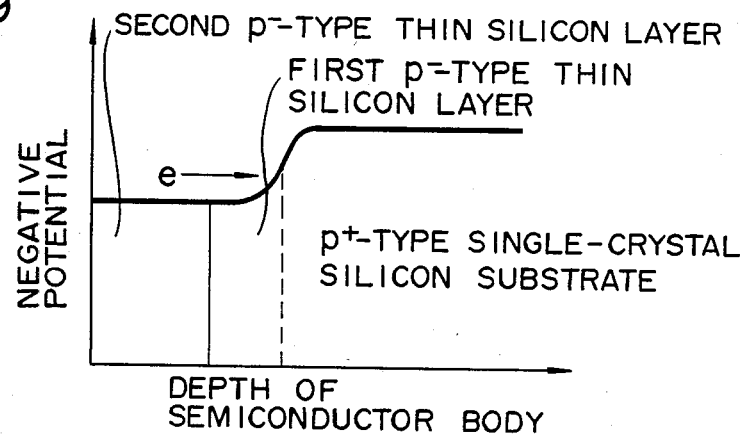
FIG. 9 is a graph showing the relationship between the negative potential and the depth of a semiconductor body used in the dynamic RAM device of Example 1.

As is apparent from the above table, the dynamic RAM prepared by Example 1 had a low soft error rate, a long pause time, and a high bump-up percentage. This is because the first p⁻-type thin silicon layer 102 with a high resistivity and a number of microdefects 103' was formed on the major surface of the p⁺-type single-crystal silicon substrate 101 having microdefects 103 therein, and the second p⁻-type thin silicon layer 104 with a high resistivity was formed on the first thin silicon layer 102. More particularly, when electrons were accidentally generated upon irradiation of α-rays on the second thin silicon layer 104 of the semiconductor body 105, most of these electrons move in the vertical direction. Since a great potential barrier was not present, as shown in FIG. 9, at the interface between the second thin silicon layer 104 and the first thin silicon layer 102 having the microdefects 103', the electrons entered the layer 102. In the first thin silicon layer 102, they easily recombined with the holes at the microdefects thereby preventing the soft error. Similarly, when the carriers were accumurated in the n-type layer 110 formed in a portion of the second thin silicon layer 104 which was located under the capacitor electrode 111 of the dynamic RAM, most of the minority carriers (electrons) moved in a vertical direction they entered the first thin silicon layer 102 provided under the second thin silicon layer 104. In the layer 102, they easily recombined with the holes at the microdefects 103'. For this reason, the carriers (i.e., electrons) did not erase the charges under the capacitor electrode 111, thereby prolonging the pause time, as shown in the above table. In addition, the substrate of the semiconductor body 105 of the dynamic RAM of Example 1 had a low resistivity (e.g., 0.01 Ωcm), so that the changes in potential at the substrate 101 decreased, thereby greatly increasing the allowance in the bump-up test.

The bump-up percentage of the dynamic RAM of Control 1 was high. However, when electrons were generated or produced in the p⁻-type thin single-crystal silicon layer 203 upon irradiation of α-rays, these electrons were reflected by the junction between the p⁻-type thin single-crystal silicon layer 203 and the p⁺-type substrate 201 and were not be gettered by the microdefects 202 formed in the substrate 201. For this reason, as shown in the table, a soft error tends to occur. In addition to this disadvantage, the pause time was shorter than that of the dynamic RAM (Control 3) having the p⁻-type single-crystal silicon substrate 401. The dynamic RAM (Control 2) having the p⁻-type single-crystal silicon substrate 301 had a lower soft error rate than that of the dynamic RAM of Control 1 but a higher soft error rate than that of the dynamic RAM of Example 1. In addition, the single-crystal silicon substrate 301 had a high resistivity, so the dynamic RAM of Control 2 had a lower bump-up percentage than that of the dynamic RAMs of Example 1 and Control 1.

EXAMPLE 2

According to Example 2, the present invention is applied to the manufacture of a CMOS-IC.

Figure 10A:
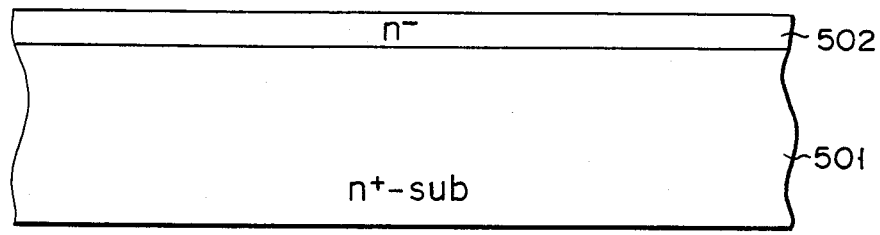
FIGS. 10A to 10L are sectional views for explaining the steps in manufacturing a CMOS-IC according to Example 2 of the present invention.

As shown in FIG. 10A, a phosphorus-doped n⁺-type single-crystal silicon substrate 501 having a resistivity of 0.01 Ωcm and the (100) crystal direction is prepared. Then a first n⁻-type thin single-crystal layer 502 is epitaxially grown on the silicon substrate 501 in an atmosphere of $SiCl_4$ and $H_2$ at 1,180° C. for three minutes. The first thin layer 502 has a resistivity of 10 Ωcm and a thickness of 3 μm. Note that the silicon substrate 501 comprises one wafer obtained by pulling up a single-crystal silicon ingot in accordance with the CZ technique. The initial oxygen concentration of the single-crystal silicon substrate 501 is $1 \times 10^{18}$ cm⁻³.

Figure 10B:
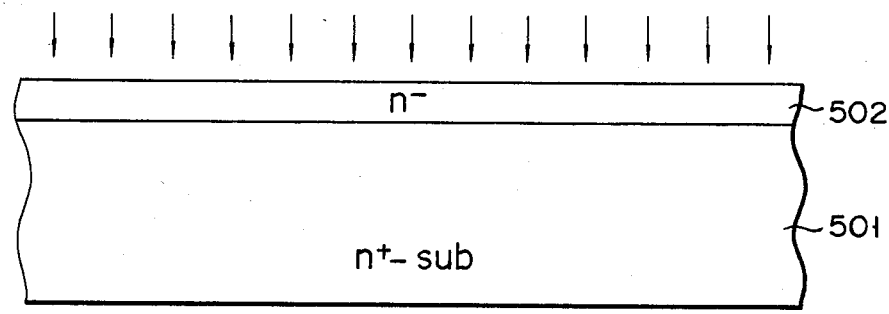
Figure 10C:
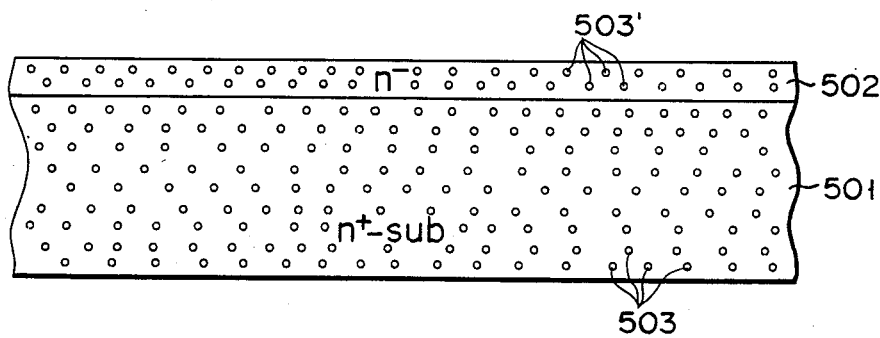
Figure 10D:
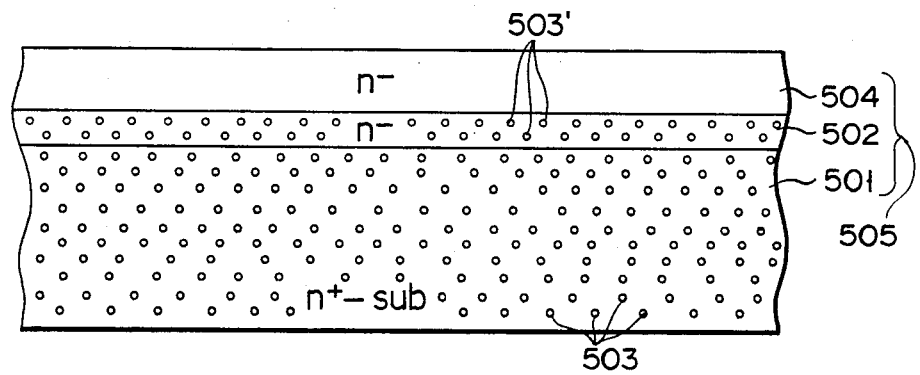

As shown in FIG. 10B, oxygen is ion-implanted at an acceleration voltage of 100 keV and a dose of $1 \times 10^{16}$ cm⁻² in the first thin silicon layer 502. The resultant structure is then annealed in an oxygen atmosphere at a temperature of 700° C. for eight hours. In this case, as shown in FIG. 10C, microdefects 503 occur in the silicon substrate 501. At the same time, microdefects 503' are formed in the first thin silicon layer 502. Subsequently, as shown in FIG. 10D, a second n⁻-type single-crystal silicon layer 504 is formed by epitaxial growth on the first thin silicon layer 502 in an atmosphere of $SiCl_4$ and $H_2$ at a temperature of 1,180° C. for five minutes. The second thin silicon layer 504 has a resistivity of 10 Ωcm and a thickness of 5 μm. The silicon substrate 501 having the microdefects 503, the first thin silicon layer 502 having the microdefects 503' and the second thin silicon layer 504 consitute a semiconductor body 505.

Figure 10E:
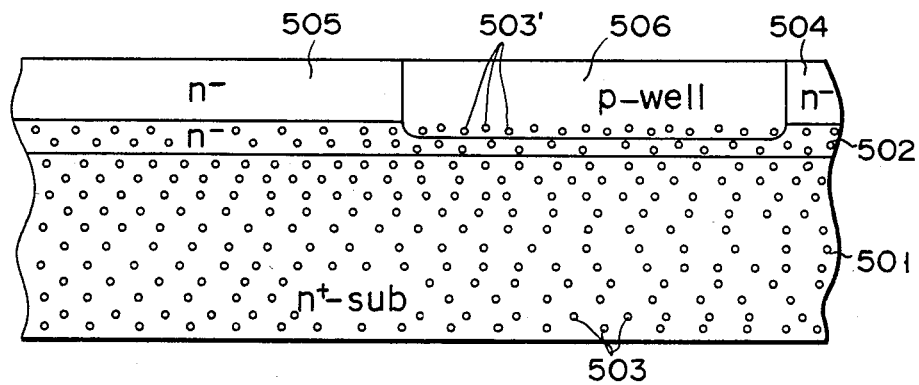

The resultant structure is thermally oxidized to form a buffer oxide film (not shown) on the second thin silicon layer 504; and a photoresist pattern (not shown) having an opening corresponding to a prospective p-well region is formed in accordance with the PEP (photoengraving process). A p-type impurity such as boron is ion-implanted in the resultant structure at an acceleration voltage of 100 keV and a dose of $2 \times 10^{12}$ cm⁻² by using the photoresist pattern as a mask. The photoresist pattern is then removed; and the resultant structure is annealed at a temperature of 1,000° C., thereby selectively forming a p-well 506 extending from the second thin silicon layer 504 to the first thin silicon layer 502 having the microdefects 503', as shown in FIG. 10E. The p-well 506 has a junction depth of about 7 μm and a resistivity of 4 Ωcm. Thereafter, the buffer oxide film is removed.

Figure 10F:
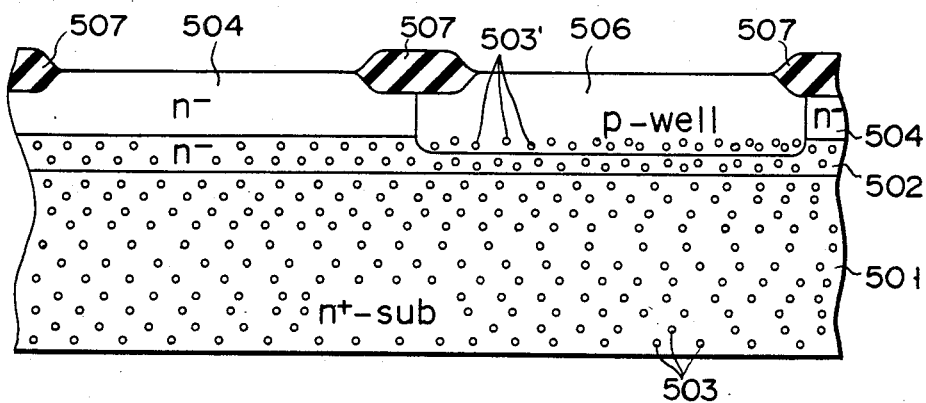
Figure 10G:
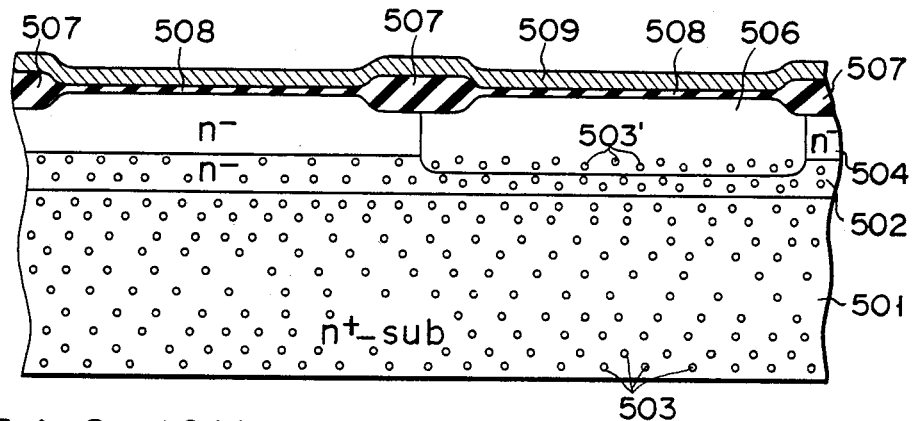

As shown in FIG. 10F, ion implantation of boron and phosphorus and selective oxidation are performed to form a field oxide film 507 on the surfaces of the second thin silicon layer 504 and the p-well 506. At the same time, a p-type inversion preventive layer (not shown) and an n-type inversion preventive layer (not shown) are formed in portions of the p-well 506 and the second thin silicon layer 504 which are located under the field oxide film 507. As shown in FIG. 10G, thermal oxidation is performed to form gate oxide films 508 on the island regions of the second thin silicon layer 504 and the p-well 506 which are isolated by the field oxide film 507. Each of the gate oxide films 508 has a thickness of about 250 Å. Subsequently, a polycrystalline silicon film is deposited by the CVD method to cover the entire surface to a thickness of 3,500 Å. Phosphorus ions are doped in the polycrystalline silicon film to obtain a phosphorus-doped polycrystalline silicon film 509.

Figure 10H:
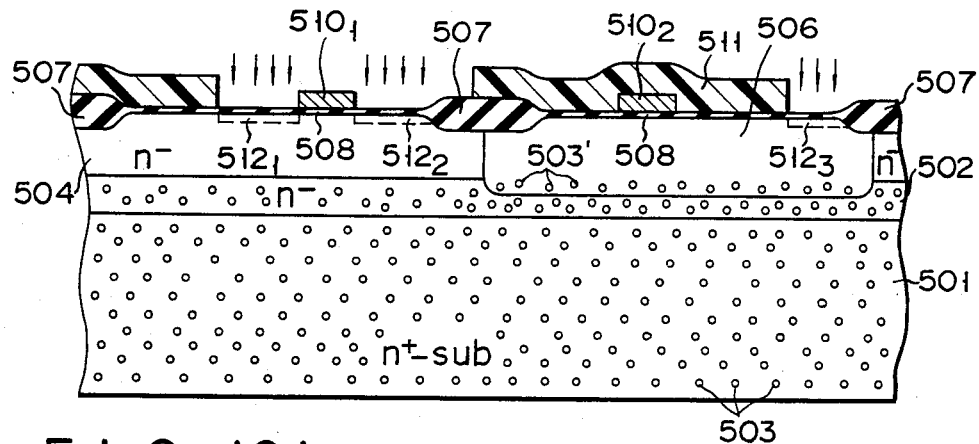

A photoresist pattern (not shown) having openings corresponding to the prospective gate regions is formed by PEP, and the phosphorus-doped polycrystalline silicon film 509 is selectively etched by the reactive ion etching (RIE) method by using the photoresist pattern as a mask. As a result, gate electrodes $510_1$ and $510_2$ are respectively formed on the gate oxide films 508 in the island regions, as shown in FIG. 10H. The resist pattern is then removed, and a photoresist pattern 511 is formed by further PEP. A p-type impurity such as boron is ion-implanted at an acceleration voltage of 100 keV and a dose of $1 \times 10^{15}$ cm$^{-2}$ by using the photoresist pattern 511 as a mask, thereby forming boron ion-injected layers $512_1$ to $512_3$.

Figure 10I:
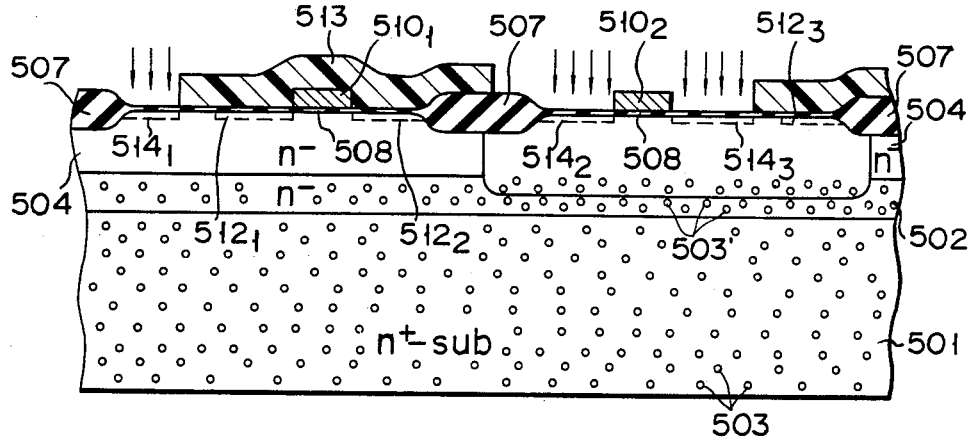
Figure 10J:
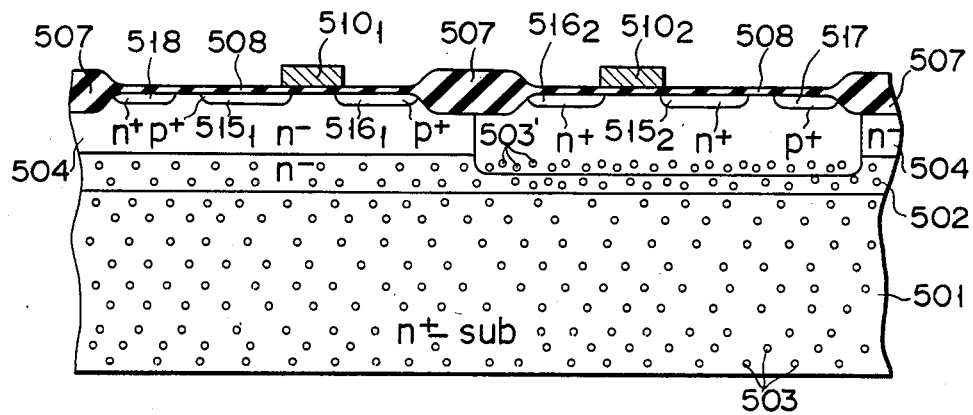

As shown in FIG. 10I, the photoresist pattern 511 is removed, and in turn a photoresist pattern 513 is formed by PEP. An n-type impurity such as arsenic is ion-implanted at an acceleration voltage of 100 keV and a dose of $1 \times 10^{15}$ cm$^{-2}$ by using the photoresist pattern 513 as a mask, thereby forming arsenic ion-injected layers $514_1$ to $514_3$. After the photoresist pattern 513 is removed, the resultant structure is annealed at a temperature of 1,000° C., thereby activating the boron ion-injected layers $512_1$ to $512_3$ and so forming p$^+$-type source and drain regions $515_1$ and $516_1$ in the island region of the second thin silicon layer 504 and a p$^+$-type diffusion region 517 in the island region of the p-well 506, as shown in FIG. 10J. At the same time, the arsenic ion-injected layers $514_1$ to $514_3$ in the island regions of the second thin silicon layer 504 and the p-well 506 are activated to form n$^+$-type source and drain regions $515_2$ and $516_2$ in the island region of the p-well 506, and an n$^+$-type diffusion region 518 in the island region of the second thin silicon layer 504. Therefore, a p-channel MOS transistor having the p$^+$-type source region $515_1$, the p$^+$-type drain region $516_1$, the gate oxide film 508 and the gate electrode $510_1$ is prepared. Similarly, an n-channel MOS transistor having the n$^+$-type source region $515_2$, the n$^+$-type drain region $516_2$, the gate oxide film 508 and the gate electrode $510_2$ is prepared.

Figure 10K:
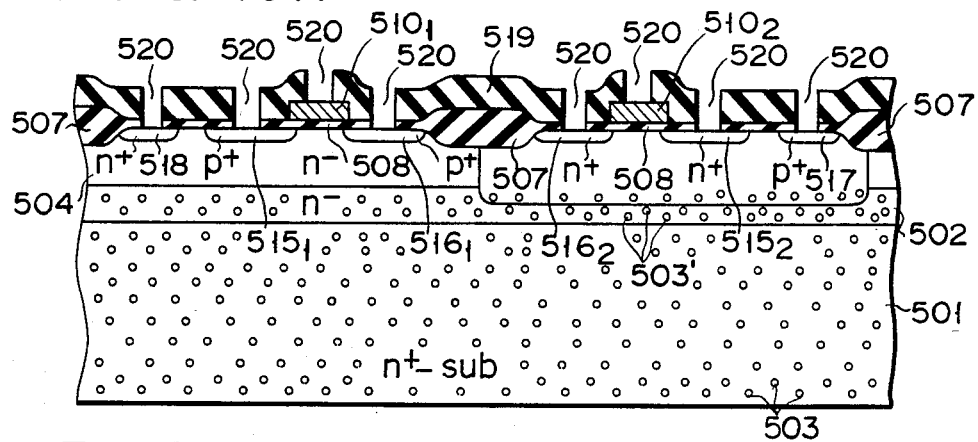
Figure 10L:
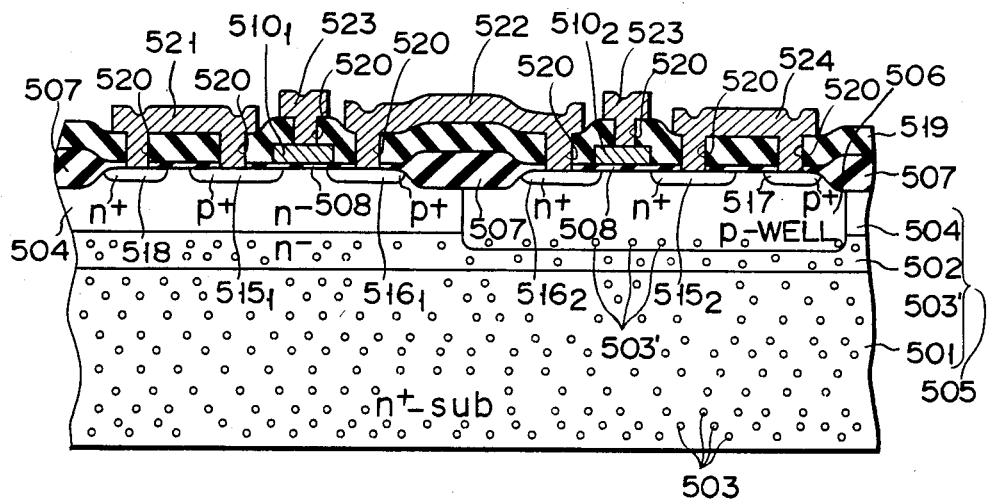

As shown in FIG. 10K, an SiO$_2$ film 519 is deposited by the CVD method to cover the entire surface. By using a photoresist pattern (not shown) formed by the PEP, the SiO$_2$ film 519 and the gate oxide films 508 (the SiO$_2$ film 519 only for the gate electrodes $510_1$ and $510_2$) are selectively etched to form contact holes 520 which respectively correspond to the source regions $515_1$ and $515_2$, the drain regions $516_1$ and $516_2$, the p$^+$-type diffusion region 517 and the n$^+$-type diffusion region 518. An aluminum film is deposited to cover the entire surface and is etched by using a photoresist pattern (not shown) as a mask. Therefore, as shown in FIG. 10L, an Al source wiring strip 521 is formed on the SiO$_2$ film 519 and is in contact with the p$^+$-type source region $515_1$ and the n$^+$-type diffusion region 518 through the corresponding contact holes 520. Similarly, an Al drain wiring strip 522 is formed on the SiO$_2$ film 519 and is in contact with the drain regions $516_1$ and $516_2$ through the corresponding contact holes 520. An Al gate wiring strip 523 is formed on the SiO$_2$ film 519 and is in contact with the gate electrodes $510_1$ and $510_2$ through the corresponding contact holes 520. In addition, an Al source wiring strip 524 is formed on the SiO$_2$ film 519 and is in contact with the n$^+$-type source region $515_2$ and the p$^+$-type diffusion region 517 through the corresponding contact holes 520. As a result, a CMOS-IC is prepared. The Al gate wiring strip 523 is connected to the Vin terminal; the Al drain wiring strip 522 is connected to the Vout terminal; the Al source wiring strip 521 of the p-channel MOS transistor is connected to the $V_{DD}$ terminal, and the Al source wiring strip 524 of the n-channel MOS transistor is connected to the $V_{SS}$ terminal.

According to Example 2, the first n$^-$-type thin single-crystal silicon layer 502 having microdefects 503' is formed on the n$^+$-type single-crystal silicon substrate 501 having microdefects 503; and the second n$^-$-type thin single-crystal silicon film 504 having no microdefects is formed on the first thin silicon layer 502. The p-well 506 is formed extending from the second thin silicon layer 504 to the first thin silicon layer 502 in the semiconductor body 505. The p-channel MOS transistor is formed in the island region of the second thin silicon layer 504; and the n-channel MOS transistor is formed in the island region of the p-well 506, thereby obtaining a highly integrated CMOS-IC.

Along with the increase in packing density of CMOS-ICs, the source regions $515_1$ and $515_2$, and the drain regions $516_1$ and $516_2$ of the respective MOS transistors are micropatterned. When the p-channel MOS transistor is turned on, electrons are generated in the island region of the second thin silicon layer 504 which is in the vicinity of the drain region $516_1$ due to impact ionization. A high potential barrier is not present at the interface between the second thin silicon layer 504 and the underlying first thin silicon layer 502 having microdefects 503'. Hence, most of the electrons generated in the second thin silicon layer 504 move in the vertical direction into the first thin silicon layer 502 and recombine with the holes at the microdefects 103'. As a result, a parasitic pnp transistor having a p$^+$-type source region 515 as the emitter, a second thin silicon layer 504 as the base, and a p-well 506 as the collector will not be subjected to bipolar action. On the other hand, when the n-channel MOS transistor is turned on, holes are generated in the island region of the p-well 506 which is in the vicinity of the n$^+$-type drain region $516_2$ due to impact ionization. In this case, since the p-well 506 is formed extending from the second thin silicon layer 504 to the first thin silicon layer 502 having microdefects 503', the holes generated in the p-well region 506 easily recombined with the electrons at the microdefects 503' near the bottom of the region 506. Therefore, the potential of the p-well 506 will not increase even if the holes are generated therein. The parasitic npn transistor having the n$^+$-type source region $515_1$ as the emitter, the p-well 506 as the base and the second thin silicon layer 504 as the collector is not subjected to bipolar action. Unlike the conventional case, a large current will not flow from the $V_{DD}$ terminal to the $V_{SS}$ terminal, thereby providing a CMOS-IC greately resistant to the latch-up phenomenon.

In Examples 1 and 2, the present invention is exemplified by the manufacture of a dynamic RAM and a CMOS-IC. However, the present invention can also be applied to the manufacture of a 6-transistor type static RAM.

According to the present invention described above, there is provided a method for manufacturing a semiconductor device comprising: has a semiconductor base obtained such that a first thin single-crystal silicon layer having microdefects and a higher resistivity (not less than 1 Ωcm) than that of the semiconductor substrate having a low resistivity of not more than 0.5 Ωcm and microdefects is formed on the semiconductor substrate; and a second thin single-crystal silicon layer having a higher resistivity than that of the semiconductor substrate but no microdefects is formed on the first thin single-crystal silicon layer. When the semiconductor device is used as a dynamic RAM, it has a low soft error rate, a long pause time and a high bump-up percentage. When it is used as a CMOS IC, it is greately resistant to the latch-up phenomenon.

What we claim is:

1. A method for growing a resistive epitaxial layer on a short lifetime EPI-layer, comprising the steps of:

forming a first thin single-crystal semiconductor layer on a semiconductor substrate of one conductivity type which contains oxygen, said first thin single-crystal semiconductor layer having a higher resistivity than that of said semiconductor substrate and the same conductivity type as that of said semiconductor substrate;

ion-implanting an electrically inactive impurity in said first thin single-crystal semiconductor layer;

forming a second thin single-crystal semiconductor layer on said first thin single-crystal semiconductor layer, said second thin single-crystal semiconductor layer having the same conductivity type as that of said semiconductor substrate and a higher resistivity than that of said semiconductor substrate;

performing annealing for not less than four hours at a temperature of 550° C. to 900° C. after the electrically inactive impurity is ion-implanted; and forming an element in said second thin single-crystal semiconductor layer.

2. The method according to claim 1, wherein said semiconductor substrate has an oxygen concentration of not less than $7 \times 10^{17}$ cm$^{-3}$.

3. The method according to claim 1, wherein said semiconductor substrate has a resistivity of not more than 0.5 $\Omega$cm.

4. The method according to claim 1, wherein said first and second thin single-crystal semiconductor layers respectively have a resistivity of not less than 1 $\Omega$cm.

5. The method according to claim 1, wherein said first thin single-crystal semiconductor layer has a thickness of not more than 3 $\mu$m.

6. The method according to claim 1, wherein said second thin single-crystal semiconductor layer has a thickness falling within a range between 3 $\mu$m and 10 $\mu$m.

7. The method according to claim 1, wherein the electrically inactive impurity is at least one material selected from the group consisting of oxygen, carbon, nitrogen, silicon, germanium, tin, argon, xenon, neon, and krypton.

8. The method according to claim 1, wherein the annealing is performed immediately after the electrically inactive impurity is ion-implanted.

9. The method according to claim 1, wherein the annealing is performed immediately after said second thin single-crystal semiconductor layer is formed.

10. The method according to claim 1, wherein said element comprises a cell of a dynamic random access memory, said cell comprising one transistor and one capacitor.

11. The method according to claim 1, wherein said element comprises a complementary metal oxide semiconductor transistor.

* * * * *